(12) United States Patent
Tomioka et al.

(10) Patent No.: US 8,187,981 B2
(45) Date of Patent: May 29, 2012

(54) SUBSTRATE PROCESSING METHOD, SUBSTRATE PROCESSING SYSTEM, AND COMPUTER-READABLE STORAGE MEDIUM

(75) Inventors: Kazuhiro Tomioka, Tokyo (JP); Nobuyoshi Kobayashi, Tokyo (JP); Isamu Sakuragi, Nirasaki (JP); Kazuhiro Kubota, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 923 days.

(21) Appl. No.: 11/870,641

(22) Filed: Oct. 11, 2007

(65) Prior Publication Data
US 2009/0014414 A1 Jan. 15, 2009

Related U.S. Application Data

(60) Provisional application No. 60/883,256, filed on Jan. 3, 2007.

(30) Foreign Application Priority Data

Oct. 12, 2006 (JP) ................................. 2006-278687

(51) Int. Cl.
*H01L 21/302* (2006.01)
(52) U.S. Cl. .................. 438/723; 438/706; 438/725
(58) Field of Classification Search .................. 438/706, 438/710, 712, 714, 723, 725, 724; 430/310, 430/312
See application file for complete search history.

(56) References Cited

U.S. PATENT DOCUMENTS

| | | | |
|---|---|---|---|
| 6,451,512 B1 * | 9/2002 | Rangarajan et al. | 430/313 |
| 2005/0158884 A1 * | 7/2005 | Gaynor | 438/4 |
| 2005/0186125 A1 * | 8/2005 | Matsuno et al. | 422/121 |

FOREIGN PATENT DOCUMENTS

| | | |
|---|---|---|
| JP | 2000-188331 | 7/2000 |
| JP | 2001-118842 | 4/2001 |
| JP | 2002-289586 | 10/2002 |
| JP | 2003-282698 | 10/2003 |
| JP | 2006-49798 | 2/2006 |
| JP | 2006-086411 | 3/2006 |
| JP | 2006-270004 | 10/2006 |
| WO | WO 2005/034194 | 4/2005 |

OTHER PUBLICATIONS

Office Action (with English translation) issued on Feb. 7, 2012, in counterpart Japanese Appln. No. 2006-278687 (4 pages).

* cited by examiner

*Primary Examiner* — Lan Vinh
(74) *Attorney, Agent, or Firm* — Oblon, Spivak, McClelland, Maier & Neustadt, L.L.P.

(57) ABSTRACT

A substrate processing method includes preparing a substrate having a low-k interlayer dielectric film as a to-be-etched film and a photoresist film, formed on the low-k interlayer insulating film, serving as an etching mask with a predetermined circuit pattern; etching the low-k interlayer insulating film through the photoresist film to form grooves and/or holes in the low-k interlayer insulating film; ashing the photoresist film by using hydrogen radicals generated by bring a hydrogen-containing gas into contact with a catalyst of a high temperature; and recovering damage to the low-k interlayer insulating film due to the ashing by supplying a specific recovery gas. The method further includes recovering damage to the low-k interlayer insulating film due to the etching by supplying a specific recovery gas.

8 Claims, 6 Drawing Sheets

SUBSTRATE PROCESSING METHOD, SUBSTRATE PROCESSING SYSTEM, AND COMPUTER-READABLE STORAGE MEDIUM

FIELD OF THE INVENTION

The present invention relates to a substrate processing method and a substrate processing system, in which etching is performed on a low-k interlayer dielectric film formed on a substrate by using a photoresist film having a predetermined circuit pattern as a mask, ashing is performed, and a recovery process using a recovery gas is performed.

BACKGROUND OF THE INVENTION

Recently, with an advancement of high speed, fine wiring pattern, and high density integration in semiconductor devices, there has been a request for decreasing a stray capacitance between wires and increasing a conductance of a wire to prohibit an increase of signal delay. A wire structure formed with a copper (Cu) wire having a low electrical resistance and an interlayer dielectric film of a low permittivity material, i.e., a low-k film has been widely used. In the era of a 45 nm half-pitch, a low-k film having a dielectric constant k of about 2.2 to 2.6 is required. Therefore, a porous low-k film having a lower dielectric constant has been considered as the low-l film.

The wire structure employing the low-k film and the copper wire is generally fabricated by means of a damascene method as follows. A photoresist film having a pattern corresponding to a wire pattern is first formed on the low-k film by means of a photolithography technology. Plasma etching is performed on the low-k film by using the photoresist film as a mask, thereby forming the wire pattern in the low-k film. The photoresist is then removed to leave grooves (trenches) or wire holes (vias) in the low-k film. The trenches or the vias are gap filled with wire metal, such as copper (Cu). A residual wire metal is removed by means of chemical mechanical polishing (CMP).

For the removal of the photoresist among the processes as described above, there has been employed a plasma ashing process including accomodating a substrate to be processed in a processing chamber maintained at a vacuum level, converting an oxygen-containing gas into a plasma while introducing the oxygen-containing gas, and ashing and removing the photoresist by using the plasma.

However, when ashing is performed by the plasma containing oxygen, there is a possibility that the low-k film may be damaged by oxygen radicals during the ashing process. If such damage occurs, an etching shape is damaged and the k value also rises, so that the effects of the low-k film are deteriorated.

Japanese Patent Laid-open Application No. 2006-049798 discloses a method of performing a silylation processing after ashing to recover such damage. The silylation processing reforms a surface of a damaged portion by using a silylizing agent so that an end group of the surface becomes an alkyl group such as a methyl group.

However, if ashing by using plasma of an oxygen-containing gas is performed for a long time, there is a problem in that the damage cannot be recovered sufficiently even though the silylation processing is performed.

SUMMARY OF THE INVENTION

The present invention provides a substrate processing method in which damage of a low-k interlayer insulating film (a low-k film) after removal of a resist can be recovered sufficiently, and a substrate processing system for realizing the method, and a computer-readable storage medium storing a control program for executing the processing method.

As a result of several reviews for solving the problems, the present inventors have found that if a method of generating a hydrogen radicals from a hydrogen-containing gas by employing a catalyst and performing an ashing process on a resist film by using the hydrogen radicals is adopted, the degree of recovery from damage could be enhanced and damage at the time of an ashing process could be recovered sufficiently compared with the conventional plasma ashing employing an oxygen-containing gas when a recovery process employing a recovery gas such as a silylizing agent was subsequently performed on a low-k film.

In accordance with one aspect of the invention, there is provided a substrate processing method, including: preparing a substrate having a low-k interlayer dielectric film as a to-be-etched film and a photoresist film, formed on the low-k interlayer insulating film, serving as an etching mask with a predetermined circuit pattern; etching the low-k interlayer insulating film through the photoresist film to form grooves and/or holes in the low-k interlayer insulating film; ashing the photoresist film by using hydrogen radicals generated by bring a hydrogen-containing gas into contact with a catalyst of a high temperature; and recovering damage to the low-k interlayer insulating film due to the ashing by supplying a specific recovery gas.

Further, the method further includes recovering damage to the low-k interlayer insulating film due to the etching by supplying a specific recovery gas. Preferably, the hydrogen-containing gas in the ashing is a $H_2$ gas. Further, recovering the damage is performed by means of a silylation processing employing a silylizing gas as the recovery gas. Preferably, the silylation processing is performed by employing a compound having a silazane bond (Si—N) in a molecule as the recovery gas. It is preferred that the compound having the silazane bond in the molecule is any one of TMDS (1,1,3,3-Tetramethyldisilazane), TMSDMA (Dimethylaminotrimethylsilane), and DMSDMA (Dimethylsilyldimethylamine).

Furthermore, the etching, the ashing, and the recovering are performed within individual processing chambers, respectively. Preferably, the etching, the ashing, and the recovering are performed within a same processing chamber. Further, the ashing and the recovering are performed within the same processing chamber. Preferably, the etching and the recovering are performed within a same processing chamber. It is preferred that the etching and the ashing are performed within a same processing chamber.

In accordance with another aspect of the invention, there is provided A substrate processing system, including: a dry etching device for dry etching a low-k interlayer insulating film formed on a substrate by using a photoresist film with a predetermined pattern as an etching mask, thus forming a groove and/or a hole in the low-k interlayer insulating film; an ashing device for ashing the photoresist film by employing hydrogen radicals generated by bringing a hydrogen-containing gas into contact with a catalyst of a high temperature; and a recovery processing device for recovering damage to the etched film through a recovery process by supplying a specific recovery gas.

Further, the dry etching device, the ashing device, and the recovery processing device have individual processing chambers. Preferably, the ashing device and the recovery processing device have a common processing chamber, and both the ashing process and the recovery process are performed within the processing chamber. Further, the dry etching device and the recovery processing device have a common processing chamber, and both the dry etching process and the recovery process are performed within the processing chamber. Preferably, the dry etching device and the ashing device have a common processing chamber, and both the dry etching process and the ashing process are performed within the processing chamber. Alternatively, the dry etching device, the ashing device, and the recovery processing device are configured to perform the dry etching process, the ashing process, and the recovery process within processing chambers in a vacuum state, respectively, and the substrate processing system further includes a transfer device for transferring the substrate without breaking the vacuum state between the processing chambers. It is preferred that the dry etching device, the ashing device, and the recovery processing device have a common processing chamber, and the dry etching process, the ashing process, and the recovery process are all performed within the processing chamber. Preferably, the recovery processing device is configured to perform a silylation processing employing a silylizing gas as the recovery gas.

In accordance with still another aspect of the invention, there is provided a computer-readable storage medium storing a control program operated on a computer, wherein, when executed, the control program controls a substrate processing system to execute the substrate processing method.

In accordance with the present invention, a hydrogen radical is generated from a hydrogen-containing gas by employing a catalyst, an ashing process is performed on a resist film by using the hydrogen radical, and a recovery process employing a recovery gas such as a silylizing agent is performed on a low-k film. Accordingly, damage to the low-k film after removal of the resist can be recovered sufficiently.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Embodiments of the present invention will now be described with reference to FIGS. 1 to 7.

Figure 1:
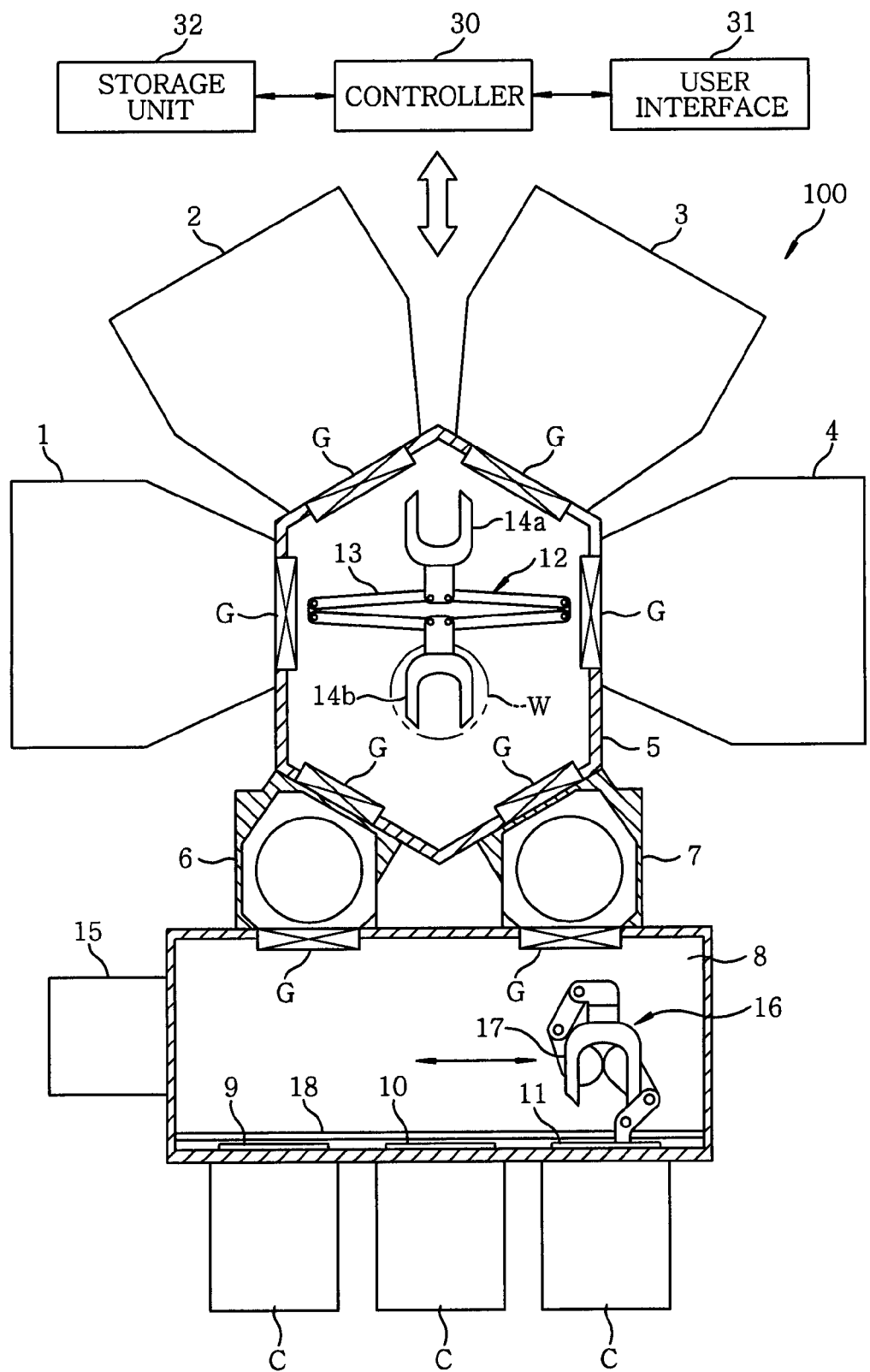
FIG. 1 is a schematic plan view illustrating a structure of a substrate processing system used to implement a substrate processing method in accordance with the present invention.

FIG. 1 is a schematic plan view illustrating a structure of a substrate processing system used to implement a substrate processing method in accordance with the present invention.

The substrate processing system 100 is configured to process a semiconductor wafer W (a substrate) in which a photoresist film, as an etching mask having a predetermined circuit pattern, is formed on a low-k film (i.e., an etching target) by means of a photolithography process. The substrate processing system 100 includes etching units 1 and 2 for plasma etching, an ashing unit 3 for ashing, and a silylation processing unit 4. The units 1 to 4 are provided to correspond four sides of a wafer transfer chamber 5 having a hexagonal shape, respectively. Loadlock chambers 6 and 7 are provided on the remaining two sides of the wafer transfer chamber 5, respectively. A wafer loading/unloading chamber 8 is provided on the opposite side of the loadlock chambers 6 and 7 to the wafer transfer chamber 5. Ports 9, 10, and 11 to which three carriers C for containing the wafer W are respectively attached are provided on the opposite side of the wafer loading/unloading chamber 8 to the loadlock chambers 6 and 7.

The etching units 1, 2, the ashing unit 3, the silylation processing unit 4, and the loadlock chambers 6 and 7 are connected to the sides of the wafer transfer chamber 5 through gate valves G, respectively as shown in the FIG. 1. They communicate with the wafer transfer chamber 5 by opening the corresponding gate valves G, and are isolated from the wafer transfer chamber 5 by closing the corresponding gate valves G. Gate valves G are also provided at portions of the loadlock chambers 6 and 7 connected to the wafer loading/unloading chamber 8. The loadlock chambers 6 and 7 communicate with the wafer loading/unloading chamber 8 by opening the corresponding gate valves G, and are isolated from the wafer loading/unloading chamber 8 by closing with corresponding gate valves G.

A wafer transfer device 12 for transferring the wafer W to and from the etching units 1 and 2, the ashing unit 3, the silylation processing unit 4, and the loadlock chambers 6 and 7 is provided within the wafer transfer chamber 5. The wafer transfer device 12 is disposed approximately at the center of the wafer transfer chamber 5, and includes two blades 14a and 14b for holding the wafer W at leading ends of a rotatable/extensible members 13 that can be rotated, advanced, and retreated. The two blades 14a and 14b are attached to the rotatable/extensible members 13 facing opposite directions therefrom. Further, the inside of the wafer transfer chamber 5 is maintained at a predetermined degree of vacuum.

Shutters (not shown) are respectively provided at the three ports 9, 10, and 11 of the wafer loading/unloading chamber 8. When the carriers C in which the wafers W are contained or which are empty are directly attached to the ports 9, 10, and 11, the shutters are opened, thereby enabling the wafer loading/unloading chamber 8 to communicate with carriers C while preventing exterior air from flowing thereinto. An alignment chamber 15 is provided at a side of the wafer loading/unloading chamber 8 and alignment of wafer W is performed therein.

A wafer transfer device 16 for transferring the wafer W to and from the carriers C and transferring the wafer W to and from the load lock chambers 6 and 7 is disposed within the wafer loading/unloading chamber 8. The wafer transfer device 16 having a multi-joint arm structure can travel on a rail 18 along an arrangement direction of the carriers C transfers the wafer W by placing the wafer W on a leading hand 17 thereof.

The substrate processing system 100 has a control device 30 and the control device 30 having a microprocessor (computer) controls constituent elements of the substrate processing system 100, connected to the control device 30, such as the processing units, the transfer system, and gas and liquid supply systems. The control device 30 is connected with a user interface 31 including a keyboard for a process manager to manage the substrate processing system 100, e.g., by inputting operational commands, a display unit for displaying an operational status of the plasma processing device, and the like.

The control device 30 is also connected to a storage unit 32 storing therein a control program for realizing a plurality of processes executed by the substrate processing system 100 under the control of the control device 30, and programs, i.e., recipes for executing processes of at the constituent elements of the substrate processing system 100 based on process conditions. The recipes are stored in a storage medium of the storage unit 32. The storage medium may be a hard disk, a semiconductor memory, or a portable one such as CDROM, DVD and flash memory. The recipes may also be transmitted from other devices, through a dedicated line, for example.

Furthermore, when a command is received from the user interface 31, the control device 30 retrives a message recipe from the storage unit to execute it, so that a desired process is performed in the substrate processing system 100 under the control of the control device 30.

Hereinafter, each of the etching unit, the ashing unit and the silylation processing units will be described.

The etching unit 1 is first described with reference to a schematic cross sectional view of FIG. 2.

The etching unit 1 is configured to perform a plasma etching on the low-k film of the semiconductor wafer W, and includes a chamber 41 of an substantially cylindrical shape in which a vacuum state can be maintained. A susceptor 43 is disposed at a bottom part within the chamber 41 with an insulating plate 42 provided therebetween. The susceptor 43 also serves as a lower electrode and the wafer W is mounted thereon. Reference numeral 44 designates a high-pass filter (HPF).

A temperature control medium circulation device (not shown) for controlling the susceptor 43 to a desired temperature by circulating the temperature control medium is disposed within the susceptor 43. A wafer holding device (not shown) for electrostatically holding the semiconductor wafer W, such as an electrostatic chuck, is disposed on the susceptor 43. A thermally conductive gas of He gas is supplied to the back surface of the wafer W by a mechanism (not shown), so that the wafer W is controlled to a predetermined temperature by the thermal conductive gas. An annular focus ring 45 is disposed on the upper peripheral portion of the susceptor 43 in such a way to surround the semiconductor wafer W (FIG. 2).

A hollow disk-shaped showerhead 47 is disposed over the susceptor 43 to face it. The showerhead 47 is held in the chamber 41 through an insulating member 46 provided therebetween (FIG. 2). The showerhead 47 is configured to introduce a processing gas for an etching process into the chamber 41. The showerhead 47 also serves as an upper electrode, and it has a gas inlet port 48 disposed at an upper central portion thereof and a plurality of gas injection holes 49 formed in the bottom surface thereof.

The gas inlet port 48 is connected to a processing gas supply source 50 for supplying the processing gas for etching through a gas supply pipe 51. An open/shut valve 52 is provided in the gas supply pipe 51. The processing gas supply source 50 includes a $CF_4$ gas supply source 53 for supplying $CF_4$ gas as an etching gas, and an Ar gas supply source 54 for supplying an Ar gas as a dilution gas. The $CF_4$ gas supply source 53 and the Ar gas supply source 54 are respectively connected to $CF_4$ gas pipe 55 and Ar gas pipe 56. The $CF_4$ gas pipe 55 and the Ar gas pipe 56 are connected to the gas supply pipe 51. An open/shut valve 57 and a massflow controller (MFC) 58, as a flow controller, are disposed in the $CF_4$ gas pipe 55. An open/shut valve 59 and a massflow controller (MFC) 60, as a flow controller, are disposed in the Ar gas pipe 56. Further, the processing gases are described for the illustrative purpose only, and the present invention is not limited thereto.

An exhaust port 61 is disposed in the bottom part of the chamber 41. The exhaust port 61 is connected to an exhaust pipe 62. The exhaust pipe 62 is connected through a pressure control valve 63 to an exhaust device 64 having a vacuum pump, such as a turbo molecular pump. The pressure control valve 63 and the exhaust device 64 are configured to enable the inside of the chamber 41 to be depressurized to a predetermined level. A loading/unloading port 65 is formed in a sidewall of the chamber 41, and is configured to be opened and shut by the gate valve G.

A first high-frequency power supply 67 for supplying high-frequency power for plasma generation is connected to the showerhead 47 serving as the upper electrode through a first matching unit 66. The showerhead 47 is connected to a low-pass filter (LPF) 68. The susceptor 43 also serving as the lower electrode is connected to a second high-frequency power supply 70 for attracting ions in plasma through a second matching unit 69. The etching unit 2 has the same configurations as those of the etching unit 1.

Furthermore, $CF_4$ gas and Ar gas, as the processing gases for etching, are introduced from the processing gas supply source 50 into the chamber 41. The $CF_4$ gas and the Ar gas are converted into plasma with a high-frequency power from the first high-frequency power supply 67. Thus, grooves and/or holes are formed by etching the low-k film through reactive ion etching (RIE) while attracting ions by applying high-frequency power from the second high-frequency power supply 70 to the susceptor 43.

The ashing unit 3 will now be described in detail with reference to a schematic sectional view of FIG. 3.

The ashing unit 3 includes a chamber 71 of an approximately cylindrical shape. The chamber 71 is configured to accommodate a semiconductor wafer W therein, and can be maintained in a vacuum state. A susceptor 72 on which the semiconductor wafer W having a photoresist film that should be peeled off and on the like is mounted is provided at a bottom part of the chamber 71. A heater 73 for heating the semiconductor wafer W is embedded in the susceptor 72. A heater power supply 74 applies an electric power ti the theater 73.

A hollow disk-shaped showerhead 75 is disposed to face the susceptor 72 at an upper side within the chamber 71. The showerhead 75 is configured to introduce a peeling gas, such as $H_2$ gas, into the chamber 71. The showerhead 75 has a gas inlet port 76 at its upper center and a plurality of gas injection holes 77 in its bottom surface.

The gas inlet port 76 is connected to a gas supply pipe 78. A $H_2$ gas supply source 79 for supplying $H_2$ gas (i.e., a peeling gas) is provided at the other end of the gas supply pipe 78. An open/shut valve 80 and a massflow controller (MFC) 81, as a flow controller, are disposed in the gas supply pipe 78. The peeling gas may be any kind of gas containing hydrogen, such as $SiH_4$, $NH_3$, and $CH_4$, which can generate hydrogen radicals (atomized hydrogen) when being brought into contact with a catalyst wire 87 of a high temperature, as well as the $H_2$ gas.

A transfer port 82 through which the semiconductor wafer W is loaded and unloaded is provided in the sidewall of the chamber 71. The transfer port 82 is opened/shut by the gate valve G. An exhaust port 83 is provided in a bottom part of the chamber 71, and is connected to an exhaust pipe 84. The exhaust pipe 84 is connected through a pressure control valve 85 to an exhaust device 86 having a vacuum pump, such as a turbo molecular pump.

The catalyst wire 87 is disposed between the suscepter 72 and the showerhead 75 within the chamber 71. The catalyst wire 87 is made of a high melting-point conductive metal, such as tungsten. A power-feed wire 88 is connected to one end of the catalyst wire 87. A variable DC power source 89 is provided in the power-feed wire 88. As the electric power is supplied from the variable DC power source 89 to the catalyst wire 87, the catalyst wire 87 is heated to a predetermined temperature of 1400° C. or more. Meanwhile, the other end of the catalyst wire 87 is grounded. Further, the material of the catalyst wire 87 is not limited to tungsten, but may include any other high melting-point metals that can withstand a high temperature of 1400° C. or more, e.g. tantalum, molybdenum, vanadium, platinum, and thorium. The high melting-point metals such as tungsten may not be a simple substance.

A window unit 90 through which the inside of the chamber can be viewed is provided, on the opposite side to the transfer port 82, in the sidewall of the chamber 71. A radiation thermometer 91 for measuring a temperature of the catalyst wire 87 is disposed outside the window unit 90.

Further, when the $H_2$ gas is introduced into the chamber 71 in a state that the catalyst wire 87 is heated to a predetermined high temperature, the $H_2$ gas contacts with the catalyst wire 87. As a result, the $H_2$ gas is excited by means of a catalytic decomposition reaction and hence becomes hydrogen radicals (atomized hydrogen) H*, so that a resist is ashed by the hydrogen radical H*.

Figure 4:
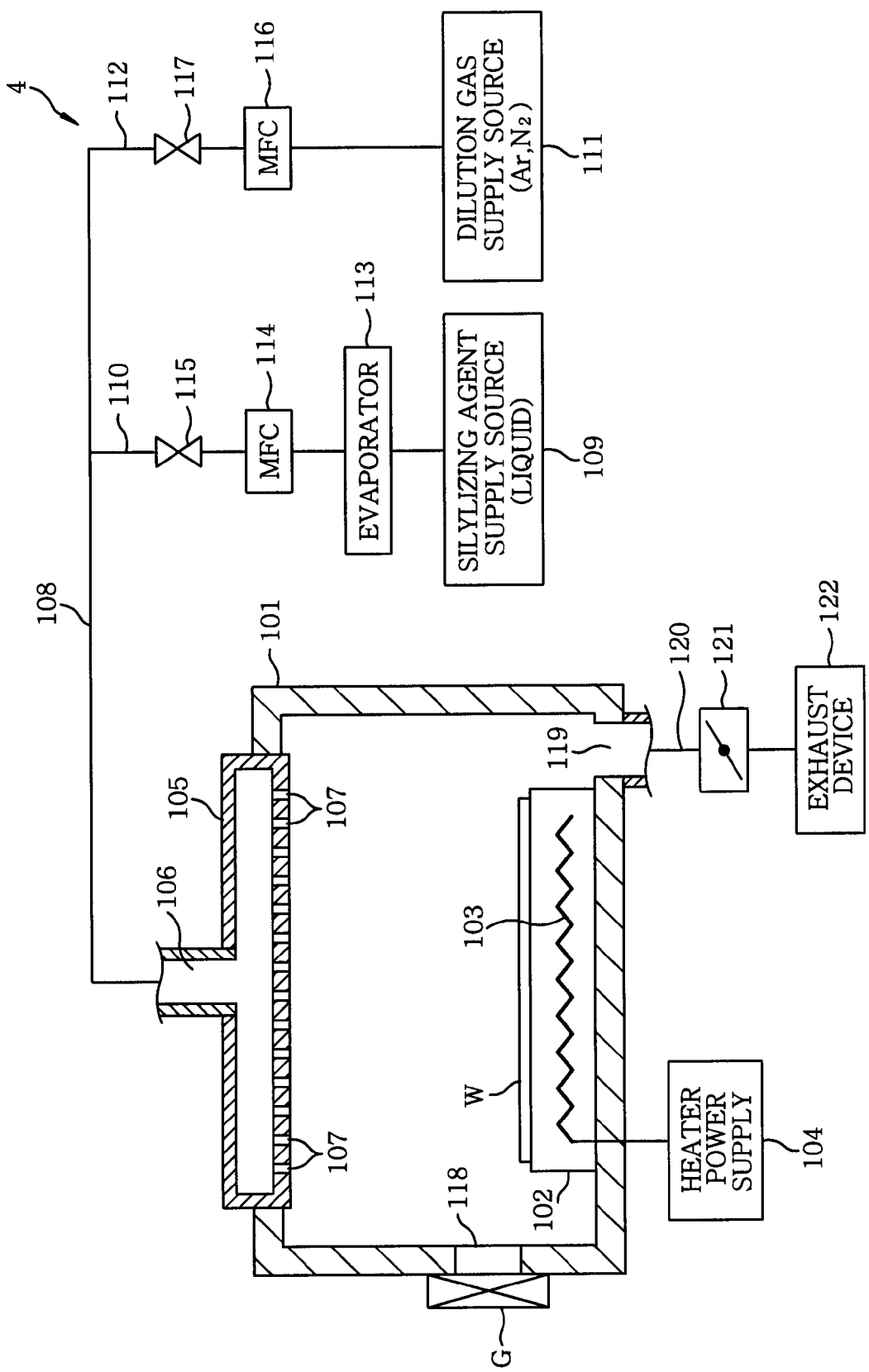
FIG. 4 is a schematic sectional view of a silylation processing unit provided in the substrate processing system of FIG. 1.

The silylation processing unit 4 for performing a recovery process will now be described with reference to a schematic cross sectional view of FIG. 4.

The silylation processing unit 4 includes a chamber 101 for accommodating the semiconductor wafer W. The chamber 101 can be maintained in a vacuum state and has a substantially cylindrical shape. At the bottom part of the chamber 101A, there is provided a suscepter 102 for mounting thereon a semiconductor wafer W that needs to be recovered. A heater 103 for heating the semiconductor wafer W is buried in the suscepter 102. An electric power from a heater power supply 104 is applied to the heater 103.

A hollow disk-shaped showerhead 105 is disposed inside the chamber 101 at an upper portion thereof to face the suscepter 102, and a silylizing agent is introduced through the showerhead 105 into the chamber 101. The showerhead 105 has a gas inlet port 106 disposed at an upper central portion thereof and a plurality of gas injection holes 107 formed in a bottom surface thereof.

The gas inlet port 106 is connected to a gas supply pipe 108. The gas supply pipe 108 is connected to both a pipe 110 and a pipe 112. The pipe 110 is extended from a silylizing agent supply source 109 for supplying a silylizing agent such as DMSDMA (Dimethylsilyldimethylamine). The pipe 112 is extended from a dilution gas supply source 111 for supplying a dilution gas such as Ar gas and $N_2$ gas. An evaporator 113 for vaporizing the silylizing agent, a massflow controller 114 and an open/shut valve 115 are provided in the pipe 110 sequentially from the silylizing agent supply source 109. Meanwhile, a massflow controller 116 and an open/shut valve 117 are provided in the pipe 112 sequentially from the dilution gas supply source 111. The silylizing agent vaporized by the evaporator 113 is introduced into the chamber 101 through the gas supply pipe 108 and the showerhead 105 while being diluted with the dilution gas. At the time of the silylation processing, the wafer W is heated to a predetermined temperature by means of the heater 103. In this case, the wafer temperature can be controlled in a range of, e.g., from a room temperature to 300° C.

A transfer port 118 through which the semiconductor wafer W is loaded and unloaded is provided in a sidewall of the chamber 101. The transfer port 118 is opened and shut by the gate valve G. An exhaust port 119 is provided at a bottom part of the chamber 101. The exhaust port 119 is connected to an exhaust pipe 120. The exhaust pipe 120 is connected through a pressure control valve 121 to an exhaust device 122 having a vacuum pump such as a turbo molecular pump.

A substrate processing using the substrate processing system 100 of FIG. 1 will now be described.

Figure 5:
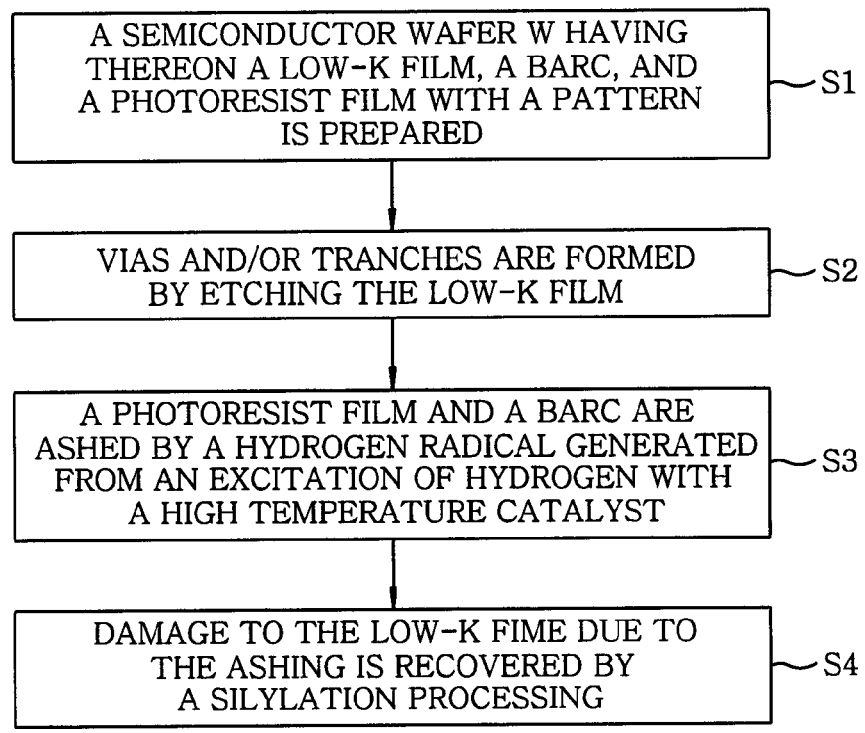
FIG. 5 is a flowchart illustrating the processes of the substrate processing method in accordance with the present invention.
Figure 6:
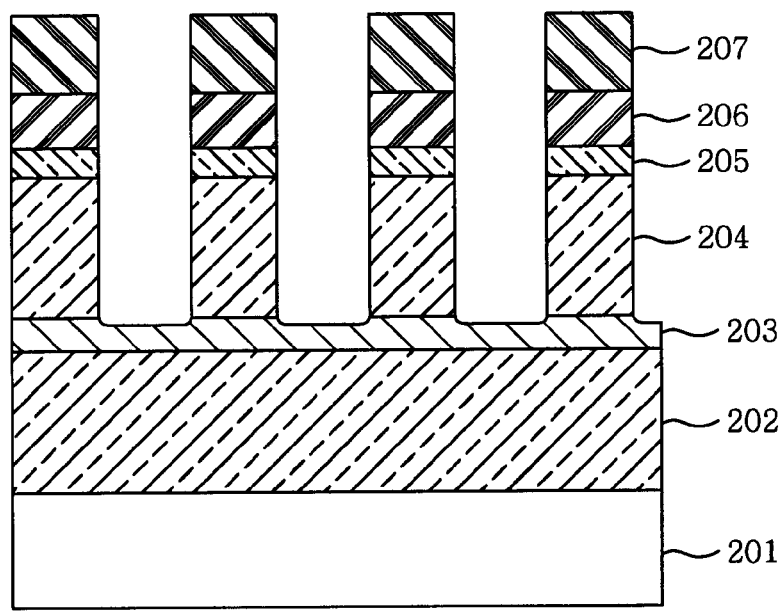
FIG. 6 is a cross sectional view illustrating a structure of a semiconductor wafer W used in the method of the present invention.

FIG. 5 is a flowchart illustrating processes performed by the substrate processing system 100. As shown in FIG. 6, a semiconductor wafer W to be processed object is prepared, wherein a $SiO_2$ film 202, an etching stopper film 203 formed from SiC, or the like, and a low-k film 204 as a to-be-etched film are sequentially formed on a Si substrate 201; a bottom anti-reflective coating (BARC) film 206 is formed over the low-k film 204 with a cap film ($SiO_2$) 205 provided therebetween; a photoresist film 207 is formed on the BARC film 206; and a predetermined wiring pattern is formed in the photoresist film 207 by means of a photolithography process (process 1). As the low-k film one having a methyl group containing Si can be used.

The prepared semiconductor wafer W is loaded into one of the etching units 1, 2 of the substrate processing system 100 and a plasma etching process is performed on the low-k film 204 of the semiconductor wafer W, thus forming vias or trenches therein (process 2). At this time, the etching is performed by introducing, e.g., $CF_4$ gas and Ar gas into into the chamber 41 and converting them into plasma.

The wafer W subjected to the etching process is transferred to the ashing unit 3. The BARC film 206 and the photoresist film 207 are removed by the following ashing process (process 3).

The gate valve G of the ashing unit 3 is opened, and the etched semiconductor wafer W is transferred through the transfer port 82 into the chamber 71, and then mounted on the suscepter 72. In this state, while the exhaust device 86 is actuated, to control the inner pressure of the chamber 71 to a predetermined vacuum degree by using the pressure control valve 85, the heater 73 is heated by the heater power source 74 so that the semiconductor wafer W on the suscepter 72 is heated to a predetermined temperature.

Meanwhile, the catalyst wire 87 is supplied with an electric power from the variable DC power source 89 and is heated to a predetermined high temperature, preferably 1400° C. to 2000° C. The temperature of the catalyst wire 87 is measured by the radiation thermometer 91.

When the catalyst wire 87 is heated to a high temperature as described above, $H_2$ gas is introduced from the $H_2$ gas supply source 79 into the chamber 71 through the gas supply pipe 78 and the showerhead 75. The flow rate of the $H_2$ gas is properly set depending on the type, amount and so on of a resist to be peeled off. For example, the flow rate of the $H_2$ gas may range from 200 to 1000 mL/min (sccm).

If the $H_2$ gas is brought in contact with the catalyst wire 87 that has been heated to a high temperature of 1400° C. or more, the $H_2$ is excited by a catalytic decomposition reaction to generate hydrogen radicals (atomized hydrogen) H*. By bringing the generated hydrogen radical in contact with the photoresist film 207 and the BARC film 206 of the semiconductor wafer W, the photoresist film 207 and the BARC film 206 are removed by ashing in a gas form of a CH-based gas such as $CH_4$ or vapor ($H_2O$) by means of the catalytic decomposition reaction. In this case, by setting the temperature of the semiconductor wafer W to 250° C. to 300° C., the ashing reaction can be performed rapidly. At this time, the semiconductor wafer W is heated by the heater 73 and is also heated by radiation heat from the catalyst wire 87. Therefore by heating the suscepter 72 to about 175° C. to 280° C. by means of the heater 73, the temperature of the wafer W can be maintained in the above range.

The semiconductor wafer W after ashing as described above is transferred to the silylation processing unit 4. A silylation process as a recovery process is then performed on the low-k film 204 damaged by the ashing process in the silylation processing unit 4 (process 4).

The silylation processing is performed in such a manner that the wafer W is first introduced into the chamber 101 after opening the gate valve G in the silylation processing unit 4, the wafer W is mounted on the susceptor 102 and then heated to a predetermined temperature by means of the heater 103, and a silylizing agent vaporized by the evaporator is diluted with a dilution gas and then supplied to the wafer W while a pressure within the chamber 101 is decreased to a predetermined level. A condition of the silylation processing in the silylation processing unit 4 may be properly selected depending on the type of a silylizing agent. For example, the temperature of the evaporator 113 may be set to from a room temperature to 200° C., the flow rate of the silylizing agent may be set to 700 sccm (mL/min) or less, the processing pressure may be set to 10 mTorr to 100 Torr (1.33 to 13330 Pa), and the temperature of the suscepter 102 may be set to from the room temperature to 200° C.

For example, when DMSDMA is used as the silylizing agent, the temperature of the suscepter 102 is set to a predetermined temperature by the heater 103, a pressure within the chamber 101 is reduced to about from 650 to 700 Pa, vapor of DMSDMA mixed with the dilution gas is then supplied until the pressure within the chamber 101 reaches about 6500 to 7500 Pa, and the pressure is maintained for, e.g., 3 minutes.

The silylizing agent is not limited to the DMSDMA, but may be any materials that generate a silylation reaction. However, materials with a relatively small molecule structure (for example, a molecular weight of 260 or less), among compounds having a silazane bond (Si—N) within a molecule, are preferable. Materials having a molecular weight 170 or less are more preferred. Specifically, e.g., HMDS (Hexamethyldisilazane), TMSDMA (Dimethylaminotrimethylsilane), TMDS (1,1,3,3-Tetramethyldisilazane), TMSPyrole (1-Trimethylsilylpyrole), BSTFA (N,0-Bis(trimethylsilyl)trifluoroacetamide), BDMADMS (Bis(dimethylamino)dimethylsilane) and so forth other than DMSDMA may be used. Chemical structures of them are as follows.

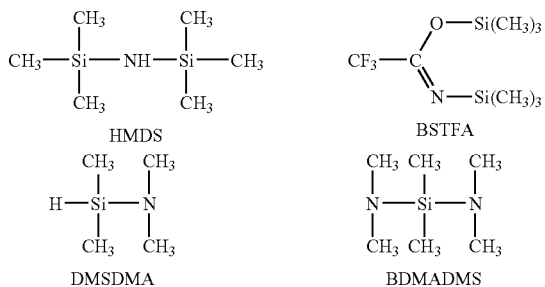

(Chemical Structure 1)

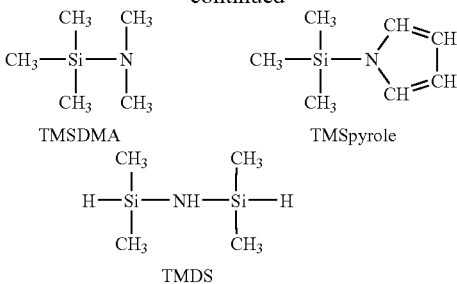

The TMSDMA and TMDS among those compounds are preferred due to a high recovery rate of a permittivity and a high reduction rate of a leak current. In terms of stability after silylation, a compound (e.g., TMSDMA, HMDS, and the like) having a structure in which Si constituting a silazane bond is bonded to three alkyl group, e.g., a methyl group is preferable.

The silylation processing of the process 4 is performed to substitute portions where a methyl group (—CH3) constituting the low-k film 204 is removed by being damaged during ashing, with Si—CH3 by means of the silylizing agent, thereby recovering the lost portions. Thus, the damaged low-k film 204 can be recovered and the k value can also be restored.

The silylation processing of the process 4 is very effective when the ashing process employing the hydrogen radical H* generated by the catalyst wire 87 in the process 3 is performed.

When the silylation process is performed as a recovery process after plasma ashing as in a conventional case, if an ashing time is long, i.e., a time period while the low-k film 204 is exposed to a plasma of an oxygen-containing gas is long, Si—CH3 of the low-k film 204 is reduced and Si—O is deeply and densely formed from the surface of the low-k film 204. Therefore, the infiltration of the silylizing agent is hindered, so that it is difficult to sufficiently recover the damage. In contrast, in the case of the above embodiment, ashing is performed by means of the hydrogen radicals generated by the catalyst without using plasma in the process 3. Accordingly, dense portions of Si—O are not generated, and the silylation processing can be performed sufficiently irrespective of an ashing time. Further, in the case of ashing using the hydrogen radicals, it is estimated that the damaged surface of the low-k film becomes not Si—O but Si—H, so that the damaged portion is easily substituted with CH$_3$. For this reason, the effect of recovering damage is greater in the case where the silylation processing is performed after an ashing by the hydrogen radical generated by using a catalyst in the present embodiment than in the case where the silylation processing is performed after a plasma ashing in the conventional case.

Further, since the low-k film 204 is also damaged by an etching process, it is preferred that the silylation processing be performed even after the etching process.

In the substrate processing system 100, the etching units 1 and 2, the ashing unit 3, and the silylation processing unit 4 are provided separately. However, when the silylizing agent is introduced into the ashing unit, the ashing and silylation processing can be carried out in one chamber. Further, when the catalyst wire is provided in the etching unit, the heater is buried in the suscepter, and the H$_2$ gas is introduced into the chamber, the etching and the ashing can be performed in one chamber. Furthermore, when the catalyst wire is provided in the etching unit, the heater is buried in the suscepter, the $H_2$ gas is introduced into the chamber, and the silylizing agent is introduced into the chamber, the etching, the ashing, and the silylation processing can be performed in one chamber. In this case, the multi-chamber system as shown in FIG. 1 is not necessary. Further, when the heater is buried in the suscepter and the silylizing agent is introduced to the chamber in the etching unit, the silylation processing after etching and ashing can be performed in one chamber. If the ashing process and the silylation process are carried out in the same chamber, the silylizing agent can be excited with the catalyst wire, so that the effects of the silylation processing can be increased.

Experimental results in which the effects in the method of the present invention were confirmed will now be described.

Figure 7A:
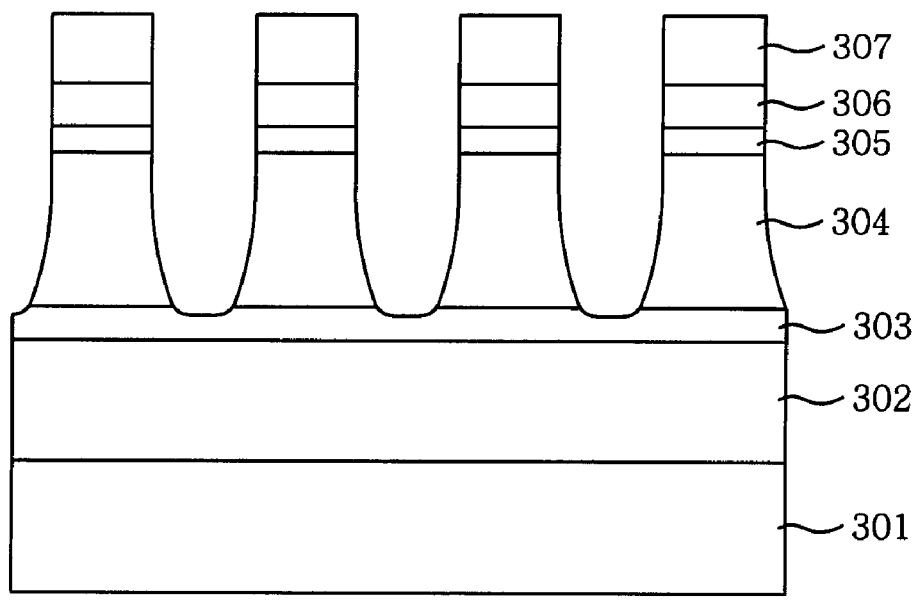
FIG. 7 is a cross sectional view illustrating a structure of a sample used in an experiment for confirming the effects of the present invention.
Figure 7B:
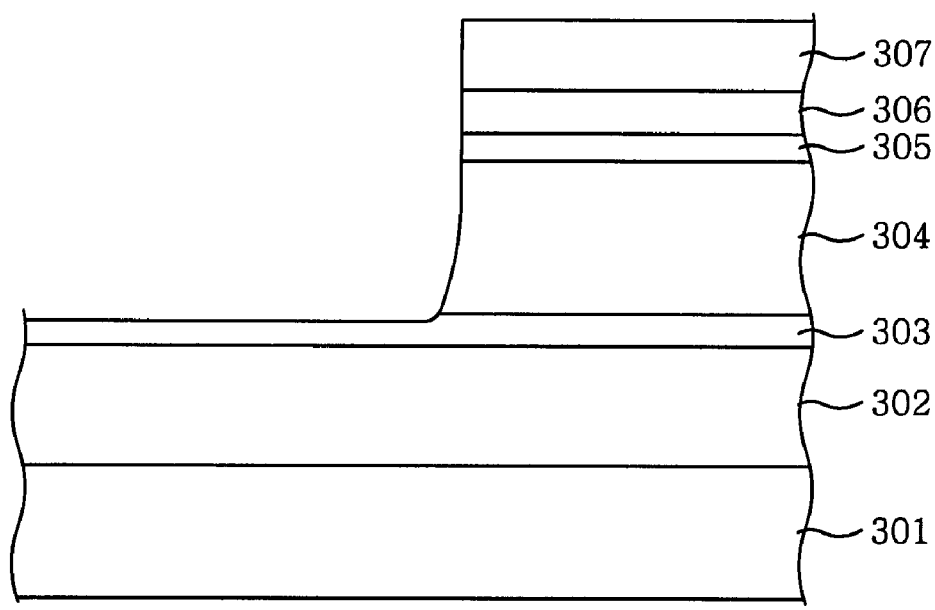

As shown in FIG. 7, a 300 mm wafer sample was prepared in which a $SiO_2$ film 302, a SiC film 303, i.e., an etching-stop film, a porous MSQ (methyl-hydrogen-SilsesQuioxane) film 304, i.e., a low-k film, a $SiO_2$ cap film 305, an organic BARC film 306, and an ArF resist film 307 were sequentially formed over a Si substrate 301, and a predetermined pattern was formed in the ArF resist film 307 by a photolithography process. A plasma etching was performed on the porous MSQ film 304 in the apparatus shown in FIG. 2, employing $CF_4$ gas and Ar gas, by using the ArF resist film 307 as a mask, thereby forming trenches of a pattern A and a pattern B shown in FIG. 7. The ArF resist film 307 and the organic BARC film 306 were removed by ashing, and a silylation processing was then executed. At this time, the porous MSQ film 304, the SiO cap film 305, the organic BARC film 306, and the ArF resist film 307 were 100 nm, 60 nm, 30 nm, and 70 nm in thickness.

An ashing process in accordance with the present embodiment is performed by hydrogen radical transformed from $H_2$ gas by using the catalyst wire of a high temperature (hereinafter, referred to as "CAT"). The ashing process in accordance with the present embodiment is compared with a conventional plasma ashing process performed by plasma transformed from $CO_2$ gas (hereinafter, referred to as "PLA").

Figure 3:
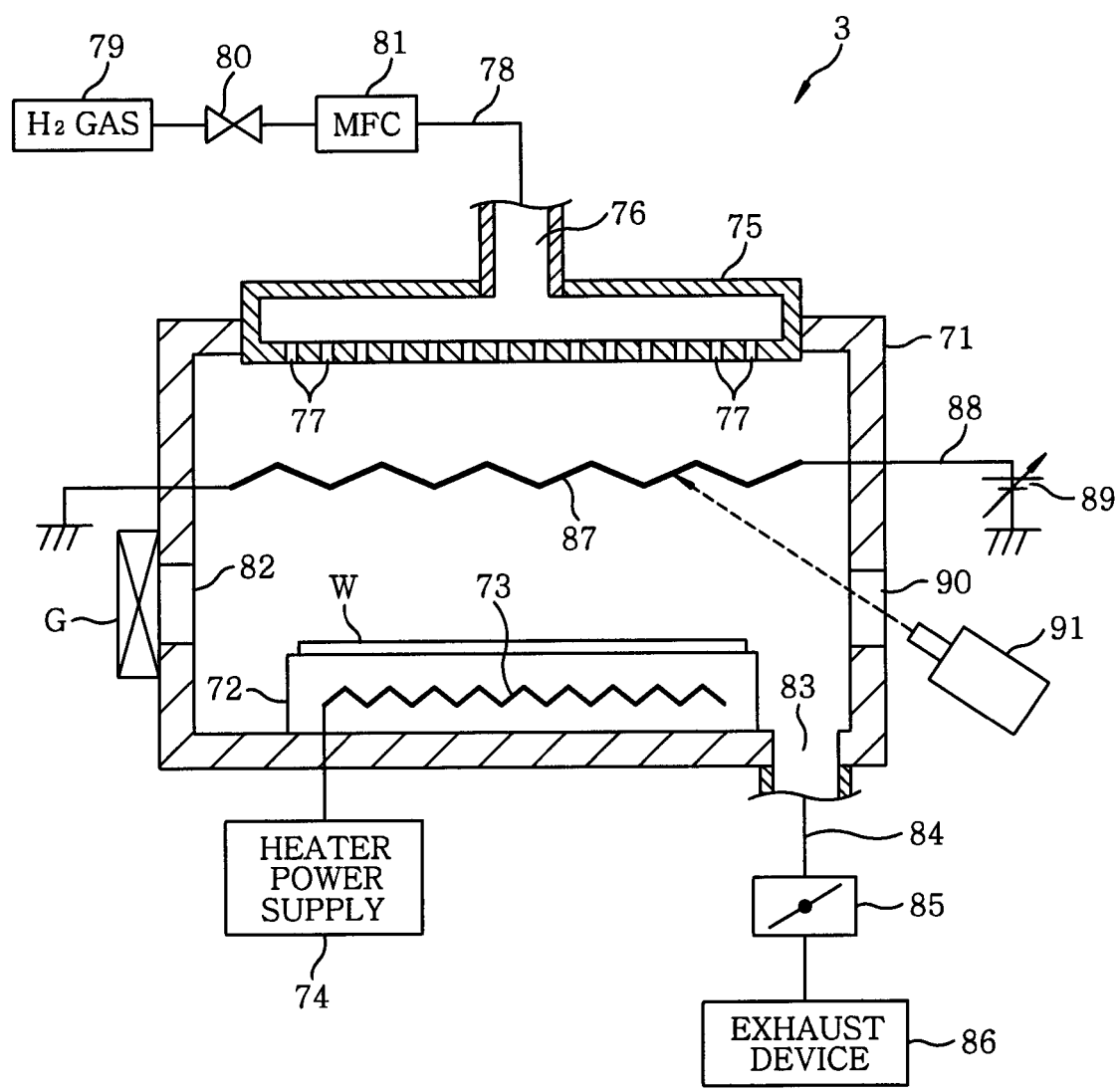
FIG. 3 is a schematic cross sectional view of an ashing unit provided in the substrate processing system of FIG. 1.

CAT was performed by the apparatus shown in FIG. 3 under 50% over-ashing conditions of a pressure within the chamber: 66.7 Pa (500 mTorr), the flow rate of the $H_2$ gas: 600 mL/min (sccm), a temperature of a tungsten filament (the catalyst wire): 1400° C., a suscepter temperature: 250° C., and time: 81 sec.

Figure 2:
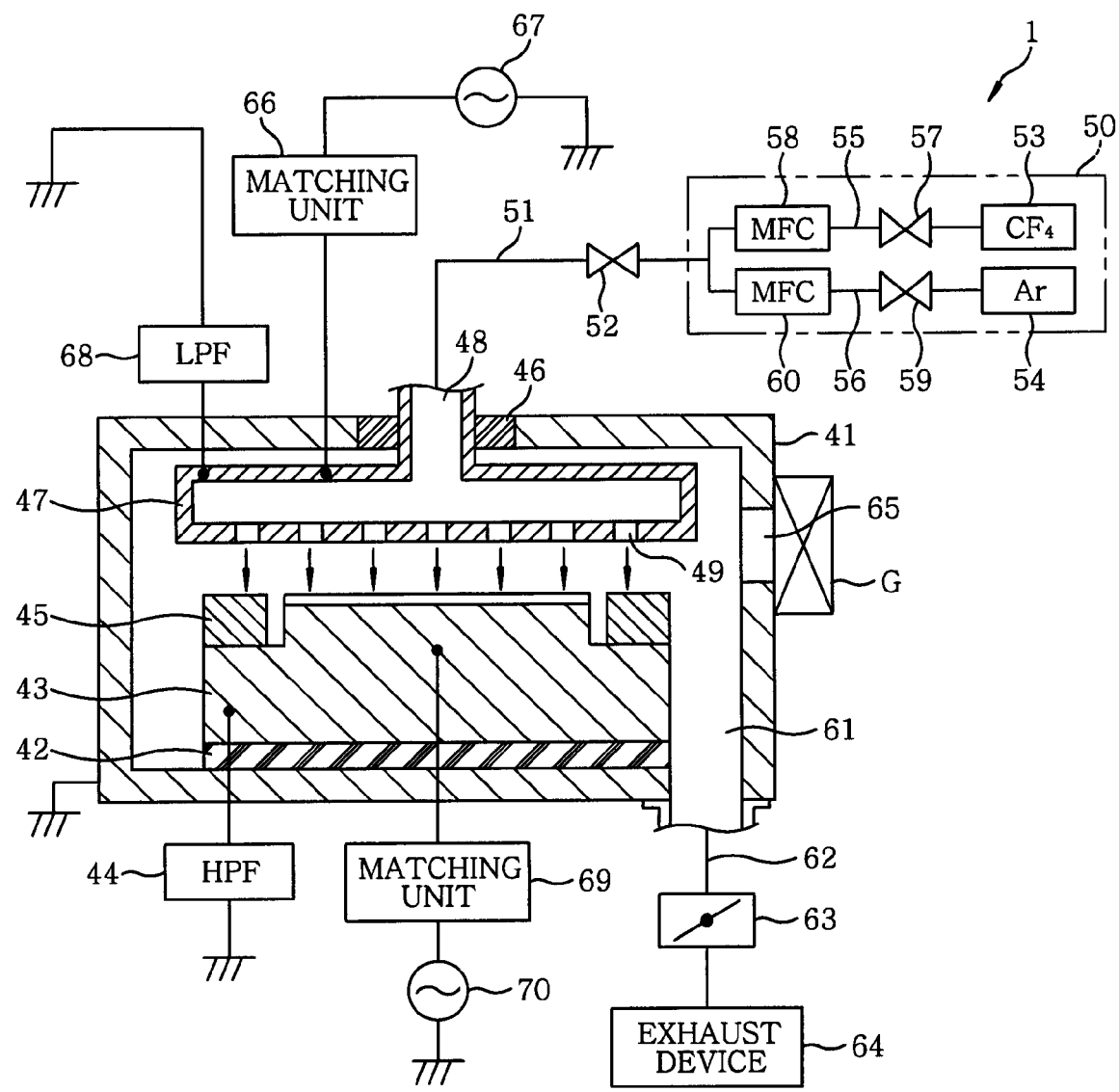
FIG. 2 is a schematic cross sectional view of an etching unit provided in the substrate processing system of FIG. 1.

PLA was performed by an apparatus similar to the etching apparatus shown in FIG. 2, in which high-frequency powers are applied to upper and lower electrodes, under 20% over-ashing conditions of a pressure within the chamber: 13.3 Pa (100 mTorr), a high frequency: 600 W (only lower electrode), the flow rate of the $CO_2$ gas: 750 mL/min (sccm), and time: 25 sec.

The silylation processing was performed under conditions of a pressure within the chamber: 7333 Pa (55 Torr), a silylizing gas: TMSDMA, a suscepter temperature: 150° C., and time: 150 sec.

The porous MSQ film 304 subjected to the ashing process and the porous MSQ film 304 subjected to the silylation processing after the ashing process were immersed in diluted fluoric acid of 0.5% for 30 seconds. The eroded thicknesses of the porous MSQ films 304 in a width direction thereof were measured. These thicknesses correspond to thicknesses of damaged portions.

The results were listed in Table 1. From Table 1, it could be seen that damages were recovered both in CAT and PLA by means of the silylation processing, but the degree of recovery was greater in the CAT than in the PLA.

TABLE 1

| | | Eroded thicknesses (nm) | | | |
| | | Right after ashing | | Silylation processing | |
| Ashing | Location | Pattern A | Pattern B | Pattern A | Pattern B |
|---|---|---|---|---|---|
| CAT | middle | 17 | 45 | 5 | 0 |
| | bottom | 17 | 36 | 2 | 0 |
| PLA | middle | 41 | 63 | 8 | 6 |
| | bottom | 39 | 38 | 7 | 0 |

Further, damages right after an etching before an ashing were 14 nm in the middle and 13 nm at the bottom of the pattern A, and were 36 nm in the middle and 14 nm at the bottom of the pattern B. From the Table, it could be seen that damages were recovered more by performing the silylation processing after ashing both in CAT and PLA than the state right after the etching.

Furthermore, the present invention is not limited to the embodiment, but may be modified in various ways. For example, in the present embodiment, as the recovery process, the silylation processing has been described, but other recovery gases may be used. As the low-k film to be etched in the present invention, other than (porous or dense) MSQ (methyl-hydrogen-SilsesQuioxane) formed by a SOD device, a SiOC-based film which is one of inorganic insulating films formed by CVD can be used. The SiOC-based film is formed by mixing a Si—CH3 bond made by introducing a methyl group —CH3 to a Si—O bond of the conventional $SiO_2$ film. Examples of the SiOC films are BlackDiamond (Applied Materials, Inc.), Coral (Novellus Co.), and Aurora (ASM Co.), which are porous or dense, but exist in both states. In the present embodiment, the BARC film is employed, and the resist film and the BARC film are peeled off at the time of a peel-off process. However, the BARC film may be omitted. The semiconductor wafer is used as a to-be-processed substrate in the present embodiment. However, the present invention is not limited thereto, but other substrates may also be used as the to-be-processed substrate.

While the invention has been shown and described with respect to the embodiments, it will be understood by those skilled in the art that various changes and modifications may be made without departing from the scope of the invention.

What is claimed is:

1. A substrate processing method, comprising:
preparing a substrate having a low-k interlayer dielectric film as a to-be-etched film and a photoresist film, formed on the low-k interlayer insulating film, serving as an etching mask with a predetermined circuit pattern;
etching the low-k interlayer insulating film through the photoresist film to form grooves and/or holes in the low-k interlayer insulating film;
ashing the photoresist film by using hydrogen radicals generated by bringing a hydrogen gas into contact with a catalyst of a high temperature, wherein the low-k interlayer insulating film is damaged by the ashing; and
recovering damage to the low-k interlayer insulating film due to the ashing by supplying a specific recovery gas,
wherein the low-k interlayer insulating film has a methyl group (—CH3) containing Si, and
wherein the damage is portions where the methyl group constituting the low-k interlayer insulating film is removed during the ashing.

2. The substrate processing method of claim 1, wherein the etching, the ashing, and the recovering are performed within individual processing chambers, respectively.

3. The substrate processing method of claim 1, wherein the etching, the ashing, and the recovering are performed within a same processing chamber.

4. The substrate processing method of claim 1, wherein the ashing and the recovering are performed within the same processing chamber.

5. The substrate processing method of claim 1, wherein the etching and the recovering are performed within a same processing chamber.

6. The substrate processing method of claim 1, wherein the etching and the ashing are performed within a same processing chamber.

7. The substrate processing method of claim 1, wherein recovering the damage is performed by means of a silylation processing employing a silylizing gas as the recovery gas.

8. The substrate processing method of claim 7, wherein the silylizing gas is any one of TMDS (1,1,3,3-Tetramethyldisilazane), TMSDMA (Dimethylaminotrimethylsilane), and DMSDMA (Dimethylsilyldimethylamine).

* * * * *